(12) United States Patent
McCollough

(10) Patent No.: US 6,215,834 B1
(45) Date of Patent: Apr. 10, 2001

(54) DUAL BANDWIDTH PHASE LOCKED LOOP FREQUENCY LOCK DETECTION SYSTEM AND METHOD

(75) Inventor: Kelvin McCollough, Austin, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 08/905,336

(22) Filed: Aug. 4, 1997

(51) Int. Cl.[7] ..................................... H03D 3/24
(52) U.S. Cl. ..................... 375/375; 375/362; 375/374; 331/14; 331/25
(58) Field of Search ..................... 375/375, 374, 375/222, 362; 331/16, 14, 25; 327/156; 377/47

(56) References Cited

U.S. PATENT DOCUMENTS

| | | | |
|---|---|---|---|
| 4,477,919 | * 10/1984 | Borras et al. | 377/47 |
| 4,875,108 | * 10/1989 | Minuhin et al. | 360/51 |
| 5,254,955 | * 10/1993 | Saeki et al. | 327/156 |
| 5,394,444 | 2/1995 | Silvey et al. | 375/374 |
| 5,661,440 | * 8/1997 | Osaka | 331/16 |

* cited by examiner

*Primary Examiner*—Stephen Chin
*Assistant Examiner*—Shuwang Liu

(57) ABSTRACT

A dual bandwidth PLL based clock generation circuit that enables device execution after frequency/phase lock has been safely achieved is provided. A PLL (410) generates a PLL clock output to a divider (430), which divides the PLL clock at a system clock output. A frequency detector (415) detects frequency/phase lock of the PLL and outputs a bandwidth control signal to selectively operate the PLL (410) in a wide or narrow bandwidth mode until the system clock is stabilized to within a predefined bandwidth of a target frequency while the PLL (410) is operating in the narrow bandwidth mode. The frequency detector (415) outputs a frequency lock signal that enables execution in a CPU (440) upon detecting that the PLL (410) has safely locked to a desired output frequency. Thus, the present invention provides a stable system clock for the system prior to the CPU (440) being allowed to begin its operation, thereby substantially avoiding system failures that may result from frequency overshoot of the system clock.

16 Claims, 3 Drawing Sheets

DUAL BANDWIDTH PHASE LOCKED LOOP FREQUENCY LOCK DETECTION SYSTEM AND METHOD

FIELD OF THE INVENTION

The present invention relates in general to a phase-locked loop (PLL) based clock generation system, and in particular to a frequency lock detector for a dual bandwidth PLL.

BACKGROUND OF THE INVENTION

When reacquiring phase-lock after being reenabled or at startup of the system, a PLL will overshoot the target frequency when initially attempting to acquire the programmed system frequency. If the PLL's targeted output frequency is at the maximum specified frequency of the system's processor, the PLL overshoot will cause memory access failures or execution failures in the processor. To prevent these problems, execution control circuitry produces a lock detect signal indicating when the PLL has locked to a programmed frequency, thereby indicating when the system can safely begin operation.

Historically, microprocessors and microcontrollers have utilized a PLL having dual bandwidth operation when the reference clock inputs are provided at low frequencies or for speeding up the locking process. A dual bandwidth PLL has two phases of operation: 1) a wide bandwidth (high gain) mode and 2) a narrow bandwidth (low gain) mode. Initially, the PLL is operated in wide bandwidth mode while a counter is used to count a delay period before the PLL is switched to the narrow bandwidth operation. Upon expiration of the delay, the PLL is transitioned into narrow bandwidth mode and the processor is released to begin execution of instructions. Thereafter, if the PLL has not acquired phase lock, the PLL transitions back to wide bandwidth mode and the counter is reinitiated. This process is repeated until the PLL has achieved phase lock. Unfortunately, if the system is operated at full frequency while acquiring phase lock, the overshoot of the PLL's output frequency of the PLL while operating in wide bandwidth mode can produce critical system failures. Therefore, it would be desirable to provide a system that will ensure that the PLL has fully settled prior to allowing the CPU to begin full speed operation and preventing such failures.

DESCRIPTION OF A PREFERRED EMBODIMENT

The present invention provides a dual bandwidth PLL based clock generation circuit that enables device execution after frequency/phase lock has been safely achieved. A PLL generates a PLL clock output to a divider, which divides the PLL clock at a system clock output. A frequency phase detector detects frequency/phase lock of the PLL and outputs a bandwidth control signal to selectively operate the PLL in a wide or narrow bandwidth mode. The bandwidth mode is determined by measuring the PLL's output clock frequency. When the PLL's output frequency is greater than a predefined bandwidth, the PLL is operated in a wide bandwidth mode, else if the PLL's output frequency is within a predefined bandwidth, it is operated in narrow bandwidth mode. When it has detected that the PLL has safely locked to a desired output frequency while operating in a narrow bandwidth mode, the frequency detector outputs a frequency lock signal that enables a CPU to begin execution. Thus, the present invention provides a stable system clock prior to the CPU being allowed to begin its operation, thereby substantially avoiding system failures that may result from operating with an unstable system clock.

Figure 1:
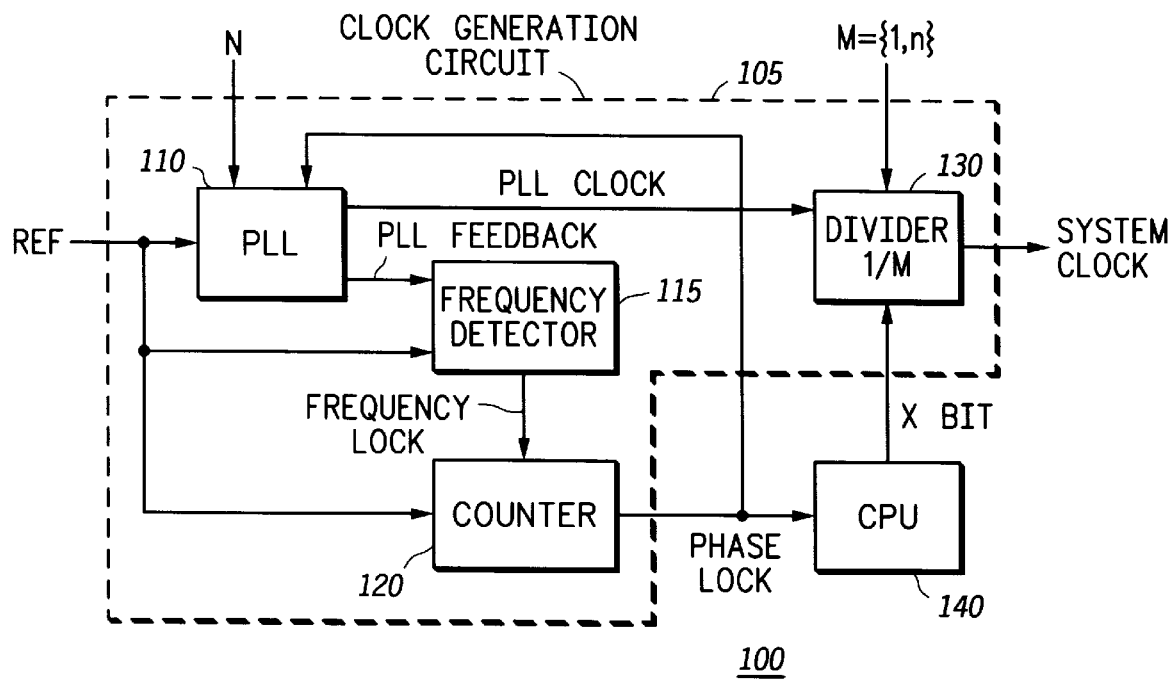
FIG. 1 shows a conventional microcontroller system having a PLL based clock generation circuit.

With reference now to the figures, and in particular with reference to FIG. 1, there is shown a conventional microcontroller system having a PLL based clock generation circuit. A data processing system 100 includes a dual bandwidth PLL clock generation circuit 105. The clock generation circuit 105 produces a SYSTEM CLOCK and indicates when the system clock has acquired a programmed frequency with a PHASE LOCK signal. A reference clock (REF) is input into PLL 110 within circuit 105, which synthesizes the reference clock to produce the PLL circuit output (PLL CLOCK) as a function of a multiplication factor input (N). PLL 110 outputs the PLL CLOCK to a divider 130 and outputs the PLL FEEDBACK to a frequency detector 115. Divider 130 is controlled by a register bit (X BIT) output by CPU 140. Divider 130 is programmed to divide the PLL CLOCK to one of two desired operating frequencies as set by an input M and selected by X BIT. In the prior art, divider 130 will typically produce a system clock equal to or half the frequency of PLL CLOCK. The frequency detector 115 outputs a FREQUENCY LOCK signal to a counter 120 when frequency detector 115 has determined that the PLL clock has reached the programmed frequency of the PLL to within a predetermined bandwidth. (As used herein, the term "frequency lock" applies to two signals being frequency locked and/or frequency/phase locked. The actual requirements would be specific for a given system.) Initially, PLL 110 operates in a wide bandwidth mode. Because the PLL must still reach a phase locked condition before the PLL can switch from the wide band to narrow band operation, an empirically derived settling time such as 10 milliseconds is counted off by counter 120 prior to switching to narrow band to ensure that the PLL has phase-locked. After the 10 milliseconds has been counted, counter 120 outputs a PHASE LOCK signal to PLL 110 to switch it to narrow bandwidth mode and to CPU 140 to enable CPU 140 to begin execution while being clocked by SYSTEM CLOCK (connection not shown).

Figure 2:
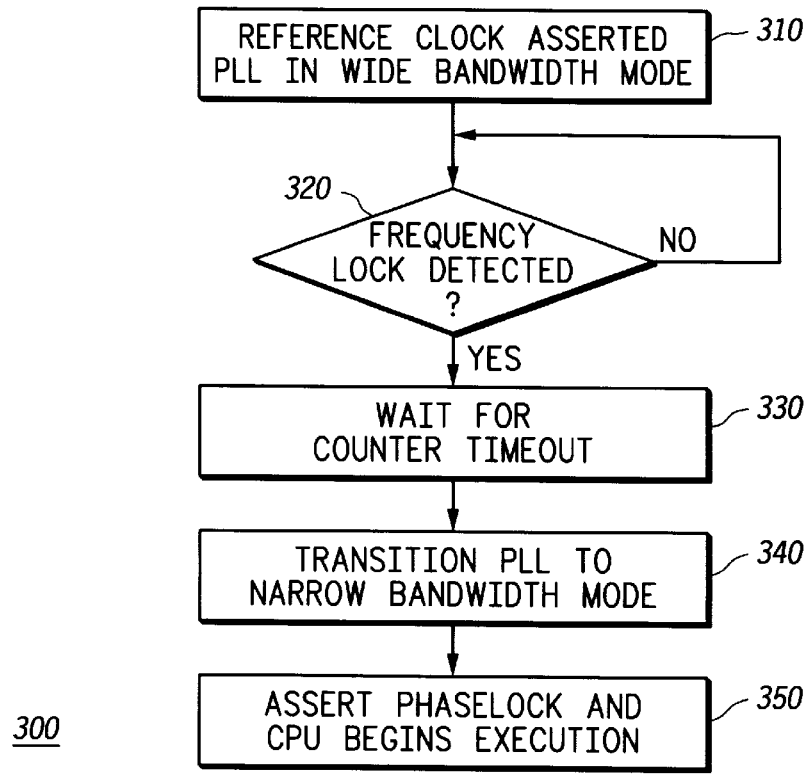
FIG. 2 shows a process for operation of the system 100 shown in FIG. 1.

FIG. 2 shows a process 300 for operation of the system 100 shown in FIG. 1. At step 310, the reference clock is asserted to the PLL, which is operating in wide bandwidth mode. At step 320, frequency detector 115 determines if frequency lock has been detected and this step is repeated until frequency lock is detected. At step 330, the process is delayed until the counter times-out, and then the PLL is transitioned to the narrow band operation as seen in step 340. At step 350, phase lock is then asserted and CPU 140 begins execution.

Figure 3:
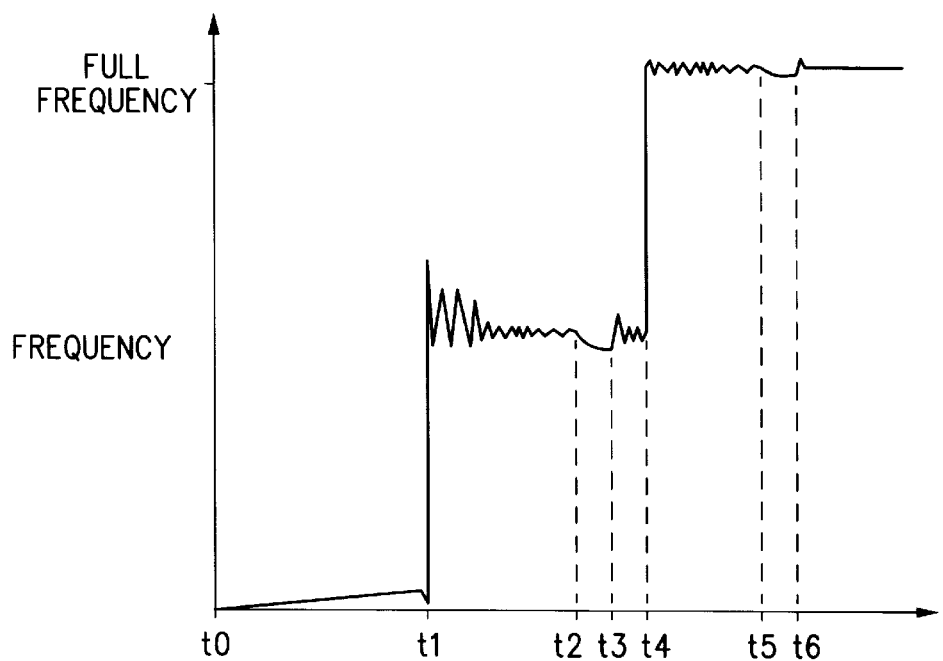
FIG. 3 graphs system clock frequency over time during a start up period for the system in FIG. 1.

With reference now to FIG. 3, there is shown a graph of the system clock frequency versus time for the system shown in FIG. 1. At time $t_0$, the reference clock is asserted at the input of the PLL. At time $t_1$, PLL 110 recognizes the input reference clock and begins to acquire frequency lock. Immediately after $t_1$, frequency detector 115 detects frequency lock and initiates counter 120 by asserting FREQUENCY LOCK. At time $t_2$, counter 120 completes its count and outputs the PHASE LOCK signal. This signal enables execution in the CPU 140 and switches PLL 110 from wide band to narrow band operation. As can be seen from FIG. 2, this results in a decay of the system clock frequency because the filter within PLL 110 has not completely settled. This is illustrated between periods $t_2$ and $t_3$ and results in loss of frequency lock. Frequency detector 115 detects this loss of frequency lock and resets counter 120, which in turn resets the PHASE LOCK output controlling the band operation of PLL 110. The PHASE LOCK signal switches PLL 110 to wide band operation to actively reacquire frequency lock. Soon after period $t_3$, frequency detector 115 detects that the PLL output is again frequency locked and again outputs the FREQUENCY LOCK signal to counter 120, which begins its count. At time $t_4$, CPU 140, which began execution at $t_2$, asserts the X-BIT, switching divider 130 to enable full frequency output of SYSTEM CLOCK. At time $t_5$, counter 120 expires and outputs PHASE LOCK, switching PLL 110 to narrow band operation. Again, as was seen at time $t_2$, the switch to narrow band operation produces a decay of the system clock frequency because the filter within PLL 110 still has not completely settled. At time $t_6$, frequency detector 115 again detects that frequency lock has been lost. This again causes counter 120 and PHASE LOCK to be reset, switching PLL 110 back into wide band operation while the CPU is being operated at full frequency. As will be appreciated, the frequency spike seen at $t_6$ may cause the CPU to be potentially clocked at greater than the maximum specified operation frequency. Therefore, the systems of the prior art create the potential for system failures by releasing the CPU before the PLL has fully settled.

Figure 4:
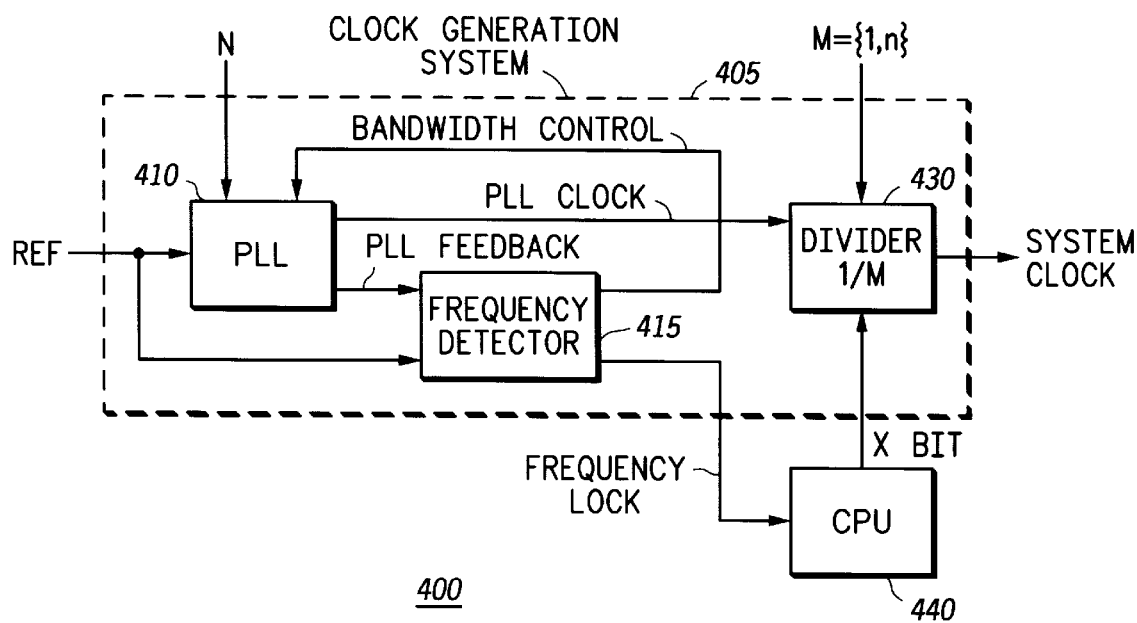
FIG. 4 shows a data processing system having a PLL based clock generation circuit, in accordance with a preferred embodiment of the present invention.

With reference now to FIG. 4, there is shown a data processing system 400 including a clock generation circuit 405, in accordance with the preferred embodiment of the present invention. The clock generation circuit 405 produces a SYSTEM CLOCK and indicates when the SYSTEM CLOCK has acquired a programmed frequency with a FREQUENCY LOCK signal. A reference clock (REF) is input into PLL 410 within circuit 405, which synthesizes the reference clock to produce the PLL circuit output (PLL CLOCK) as a function of a multiplication factor input (N). PLL 410 outputs the PLL CLOCK to a divider 430 and outputs the PLL FEEDBACK to a frequency detector 415. Divider 430 is controlled by a register bit (X BIT) output by CPU 440. Divider 430 is programmed to divide the PLL CLOCK to one of two desired operating frequencies as set by an input M and selected by the X BIT. In a preferred embodiment, divider 430 will produce a SYSTEM CLOCK equal to or half the frequency of PLL CLOCK. The programmable feature of divider 430 is particularly useful in applications where the CPU 440 transitions the system clock from one operating frequency to another. The divider 430 prevents frequency overshoot of the system clock occurring at the transition between frequencies, which can cause CPU execution errors or memory access failures, among other problems.

Frequency detector 415 performs a frequency lock detect operation to determine when the SYSTEM CLOCK has been frequency/phase locked to the input reference clock. A frequency detector circuit suitable for performing this frequency detect operation of frequency detector 415 is described in U.S. Pat. No. 5,394,444, assigned to Motorola, Inc., incorporated herein by reference. Initially, PLL 110 operates in a wide bandwidth mode. When frequency lock has been detected between the PLL FEEDBACK and input reference clock, frequency detector 415 outputs a BANDWIDTH CONTROL signal to PLL 410 that switches the bandwidth operational mode of the PLL from wide bandwidth mode to narrow bandwidth mode. Thereafter, frequency detector 415 repeats the frequency detect operation to test for frequency lock after PLL 410 has transitioned into narrow bandwidth mode. If frequency lock is not detected, PLL 410 continues to acquire lock in either the wide or narrow bandwidth mode as controlled by frequency detector 415. Frequency detector 415 operates as an intelligent control system to set the BANDWIDTH CONTROL as required to obtain lock while continuously performing the frequency detect operation. The frequency detector 415 outputs a FREQUENCY LOCK signal to CPU 440 when frequency detector 415 detects that frequency/phase lock has been achieved to within a predetermined bandwidth with PLL 410 operating in the narrow bandwidth mode, enabling CPU 440 to begin execution while being clocked by SYSTEM CLOCK (connection not shown).

One example of the operation of frequency detector 415, would include performing a frequency lock operation with a first specified number as a specified repetition count (for example, 49) by initializing a reference counter and a feedback counter, incrementing a reference counter the specified repetition number of times based on operation of the reference signal, incrementing a feedback counter based on operation of the output signal, and comparing the reference counter to the specified repetition number after the reference counter has been incremented the specified repetition number of times in order to determine whether the specified frequency lock has been acquired. This would result in determining an initial frequency lock as a specified frequency lock. The frequency lock operation is repeated for a second specified number (for example, 53) as the specified repetition count and resulting in determining the first frequency lock to determine that lock has been achieved. After switching PLL 410 to the narrow bandwidth mode, the operation is repeated with a third number as the specified repetition count. In a preferred embodiment, the first specified number, the second specified number, and the third specified number are sequentially selected from a repeating set of two relatively coprime integer repetition counts.

Figure 5:
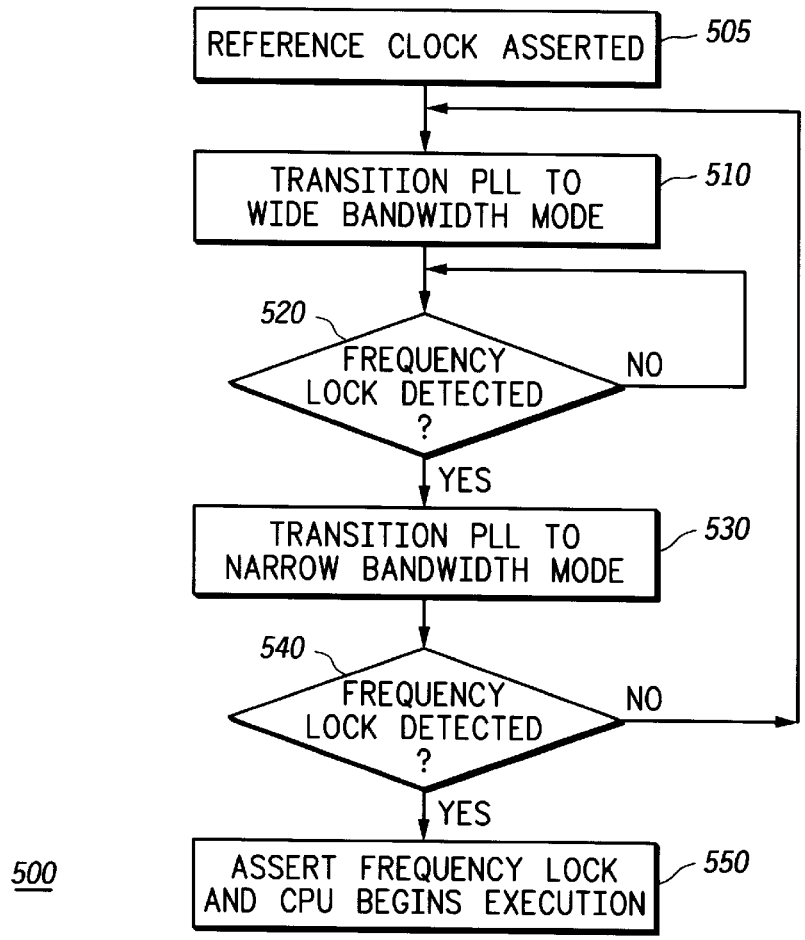
FIG. 5 shows a logic flow diagram of the operation of clock generation system of FIG. 4, in accordance with the preferred embodiment of the present invention.

With reference now to FIG. 5, there is shown a logic flow diagram 500 of the operation of clock generation system 405, in accordance with the preferred embodiment of the present invention. At step 505, the reference clock is asserted at the input of PLL 410. At step 510, PLL 410 is transitioned into a wide bandwidth mode of operation and begins to acquire frequency lock with the input reference clock. At decision block 520, it is determined by frequency detector 415 whether frequency lock has been detected between the PLL feedback and reference clock. At step 520, frequency detector 415 continues to perform a frequency lock detect test until frequency lock is detected and the process proceeds to step 530. At step 530, PLL 410 is transitioned into a narrow bandwidth mode of operation. Thereafter, frequency detector 415 repeats the frequency lock detect test at decision block 540 while PLL 410 is operating in the narrow bandwidth mode of operation. If PLL 410 has lost frequency lock after making the transition into narrow bandwidth operation, the process returns to step 510 where the PLL is transitioned into the wide bandwidth mode of operation by frequency detector 415 asserting the BANDWIDTH CONTROL signal. If instead, frequency/phase lock is detected, frequency detector 415 asserts the FREQUENCY LOCK signal to enable execution by CPU 440, as indicated at step 550.

Figure 6:
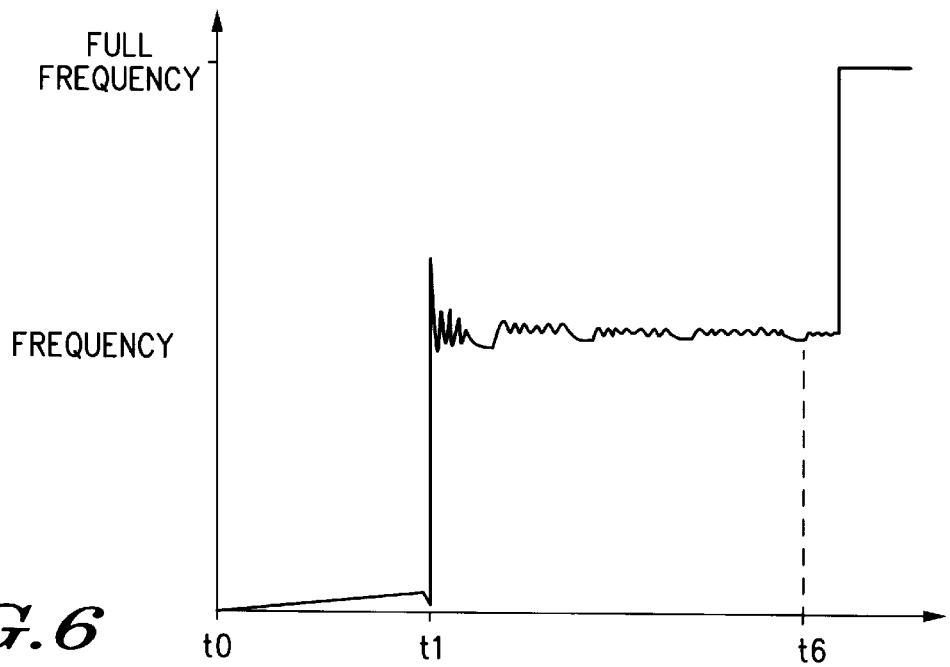
FIG. 6 illustrates a graph of the system clock frequency over time in one example of a start up period of the system of FIG. 4, in accordance with a preferred embodiment of the present invention.

With reference now to FIG. 6, there is shown the frequency of the SYSTEM CLOCK, as output from clock generation system 405, versus time, for a preferred embodiment of the present invention. At $t_0$, the reference clock is asserted at the input of the PLL. At time $t_1$, PLL 410 recognizes the input reference clock and begins to acquire frequency lock. After $t_1$, a clock generation circuit 405 implements the process of FIG. 5 to attempt to achieve frequency/phase lock with the input reference clock. At $t_6$, it is determined that frequency phase lock has been detected with PLL 410 operating in the narrow bandwidth mode. The FREQUENCY LOCK signal is then asserted by frequency detector 415 to enable CPU 440 to begin execution. Thereafter, CPU 440 asserts the X-BIT to switch divider 430 to provide a full frequency system clock.

If FIG. 6 is compared with FIG. 3, it will be appreciated that system 400 prevents operation of CPU 440 until PLL 410 has settled the system clock to a level that substantially reduces the possibility of clock overshoot related system failures. In contrast, the prior art allows CPU 140 to begin execution under a full frequency system clock prior to PLL 110 stabilizing, risking overshoot related failures. Thus, the present invention provides a stable system clock for the system prior to the system being allowed to begin its operation, thereby substantially avoiding system failures that may result from operating with an unstable system clock. Further, by algorithmically implementing a lock detect scheme such that lock detect is dynamically detected, the system will optimally allow full frequency operation at the earliest safe time, regardless of process variations or manufacturing tolerances of individual PLL's using the design of the present invention. Further, this implementation minimizes the time required to obtain phase lock, whereas the prior art relies upon an empirically calculated time period that is counted by counter 120 that may prevent the system from optimally beginning execution immediately following phase lock.

While the invention has been described in the context of a preferred embodiment, it will be apparent to those skilled in the art that the present invention may be modified in numerous ways and may assume many embodiments other than that specifically set out and described above. For example, although the preferred embodiment that has been described provided a system clock and frequency lock signal to a processor as used in a data processing system, it will be appreciated that the present invention is applicable to other embodiments where other devices could utilize the frequency locked detection system of the present invention to be safely enabled for operation with the system clock. Further, while a dual bandwidth PLL has been described, a multiple bandwidth PLL could be used that operates in three or more selected bandwidths so that the bandwidth control signal produced by the frequency detector selects from the multiple bandwidths for the PLL operation. Accordingly, it is intended by the appended claims to cover all modifications of the invention which fall within the true scope of the invention.

What is claimed is:

1. A method of enabling operation of a device in a system having a multiple bandwidth phase locked loop, wherein the multiple bandwidth phase locked loop has a first mode of operation and a second mode of operation and receives an input signal and generates an output signal, said method comprising:

A) while the phase locked loop is operating in the first mode of operation, performing a first frequency lock detect operation to determine whether the multiple bandwidth phase locked loop has acquired a first frequency lock on the input signal;

B) repeating step (A) until the first frequency lock is detected in step (A);

C) shifting the multiple bandwidth phase locked loop into the second mode of operation after the first frequency lock is detected;

D) while in the second mode of operation, performing a second frequency lock detect operation to determine whether the multiple bandwidth phase locked loop has acquired a second frequency lock on the input signal;

E) repeating steps (A), (B), (C), and (D) after shifting into the first mode of operation if the second frequency lock is not detected in step (D); and F) enabling a device to begin operation after the second frequency lock has been detected.

2. The method in claim 1 which further comprises:

operating the device at full frequency after enabling the device.

3. The method in claim 1 which further comprises:

G) after the device is enabled to begin operation, performing a third frequency lock detect operation to determine whether the multiple bandwidth phase locked loop has acquired a third frequency lock on the input signal; and H) repeating step (G) while the third frequency lock is detected in step (G).

4. The method in claim 3 which further comprises:

I) notifying the device when the third frequency lock is not detected in step (G).

5. The method in claim 1 wherein step (A) comprises:

timing a number of cycles of the input signal as a reference time;

timing a number of cycles of the output signal as a feedback time; and comparing the reference time with the feedback time to determine whether the first frequency lock has been acquired.

6. The method in claim 1 wherein step (D) comprises:

timing a number of cycles of the input signal as a reference time;

timing a number of cycles of the output signal as a feedback time; and comparing the reference time with the feedback time to determine whether the second frequency lock has been acquired.

7. The method in claim 1 wherein step (A) comprises:

(1) performing a frequency lock operation with a first specified number as a specified repetition count and resulting in determining an initial frequency lock as a specified frequency lock, and (2) if initial frequency lock is determined in substep (1), performing the frequency lock operation with a second specified number as the specified repetition count and resulting in determining the first frequency lock as the specified frequency lock.

8. The method in claim 7 wherein step (D) comprises:

performing the frequency lock operation with a third specified number as the specified repetition count and resulting in the second frequency lock as the specified frequency lock.

9. The method in claim 8 wherein:

the first specified number, the second specified number, and the third specified number are sequentially selected from a repeating set of two relatively coprime integer repetition counts.

10. A clock generation system which comprises:

a PLL that receives an input signal and generates a PLL output signal and that operates in a first mode and a second mode;

a frequency detector that detects a first frequency lock of the input signal by comparing the input signal to the PLL output signal while the PLL is in the first mode, and detects a second frequency lock of the input signal by comparing the input signal to the PLL output signal while the PLL is in the second mode, wherein the frequency detector outputs a first control signal that directs the PLL to shift into the second mode after detecting the first frequency lock, and outputs a second control signal that enables a device receiving the second control signal to begin an operation.

11. The system in claim 10 wherein:

the frequency detector outputs a control signal that directs the PLL to shift into the first mode after not detecting the second frequency lock.

12. The system in claim 10 which further comprises:

a divider that receives the PLL output signal and generates a system clock.

13. The system in claim 12 wherein, the device operates in response to the system clock.

14. The system in claim 13 wherein the divider generates the system clock at full frequency after the second control signal is output.

15. The system in claim 10 wherein:

operation of the device is disabled until the second frequency lock is detected.

16. The system in claim 10 wherein the device operates at full frequency after receiving the second control signal.

* * * * *